United States Patent [19]
Detch et al.

[11] Patent Number: 6,118,904
[45] Date of Patent: Sep. 12, 2000

[54] METHOD OF ENCODING DATA TO MINIMIZE THE NUMBER OF CODEWORDS

[75] Inventors: J. Lewis Detch, Severna Park; Alan S Ratner, Clarksville, both of Md.

[73] Assignee: The United States of America as represented by the National Security Agency, Washington, D.C.

[21] Appl. No.: 09/140,741

[22] Filed: Aug. 27, 1998

[51] Int. Cl.⁷ .............................. G06K 9/36; H04N 1/419; H03M 7/00
[52] U.S. Cl. .......................... 382/245; 358/261.1; 341/59
[58] Field of Search .................................... 382/232, 245, 382/244, 246, 247; 358/261.1, 261.2, 261.3, 427; 341/59, 67, 65

[56] References Cited

U.S. PATENT DOCUMENTS

| | | | |
|---|---|---|---|
| 3,560,639 | 2/1971 | Centanni | 358/261.1 |
| 3,748,379 | 7/1973 | Epstein et al. | 358/261.2 |
| 4,096,527 | 6/1978 | Furuta . | |
| 4,101,934 | 7/1978 | Fukuoka | 341/63 |
| 4,121,259 | 10/1978 | Preuss et al. | 358/261.1 |
| 4,626,829 | 12/1986 | Hauck . | |
| 4,922,545 | 5/1990 | Endoh et al. . | |
| 5,138,673 | 8/1992 | Yoshida et al. | 382/238 |
| 5,357,546 | 10/1994 | Meriwether et al. . | |
| 5,541,595 | 7/1996 | Meyer . | |
| 5,710,639 | 1/1998 | Kuznicki et al. . | |
| 5,748,118 | 5/1998 | McLaughlin | 341/59 |

OTHER PUBLICATIONS

International Telecommunication Union, Telecommunication Standardization Sector, T.4 (Mar. 1993) Recommendation.

Donald G. Fink, Donald Christiansen, Electronics Engineers' Handbook, 1982, 4–8 thru 4–11 and 20–99 thru 20–107, McGraw–Hill, USA.

*Primary Examiner*—Thomas D. Lee
*Assistant Examiner*—Wenpeng Chen
*Attorney, Agent, or Firm*—Robert D. Morelli

[57] ABSTRACT

A method of run-length encoding an image containing runs of white pixels and black pixels, by acquiring the image to encode; determining the length of all unique pixel run-lengths contained within the image on a line-by-line basis, irrespective of pixel color; selecting a base of a numeral system, where the base is made up of digits; generating a number of unequal-length codewords equal to the base; determining, in order, pixel run-lengths, on a line-by-line basis, for each pixel run-length contained in the image, where counting on each line starts with a particular pixel color; representing each pixel run-length determined in the last step in the numeral system of the base; determining the frequency of occurrence of each digit resulting from the last step; assigning the unequal-length codewords, according to ascending length of the unequal-length codewords, to the digits according to descending order of frequency of occurrence of the digits; and encoding the image by replacing each pixel run-length in the image represented in digit form with the corresponding unequal-length codeword.

8 Claims, 1 Drawing Sheet

METHOD OF ENCODING DATA TO MINIMIZE THE NUMBER OF CODEWORDS

FIELD OF THE INVENTION

This invention relates to image analysis, and, more particularly, to image compressing or coding.

BACKGROUND OF THE INVENTION

Data compression schemes were developed in order to reduce the amount of data transmitted. Reducing the amount of data that must be sent in order to transmit an image results in a faster transmission of the image. Images include pictorial images as well as textual images.

In an equal-length, or fixed-length, encoding method, each data element in an image to be transmitted is assigned a codeword of the same length. For example, an image to be transmitted may contain only four unique symbols W, X, Y, and Z, where W occurs fifty times, X occurs thirty times, Y occurs ten times, and Z occurs ten times. If each symbol is represented by a codeword of length two (e.g., 00, 01, 10, and 11, respectively) then it would take (50×2)+(30×2)+(10×2)+(10×2)=200 bits to transmit the image. Here, the length of the average codeword is 200/100=2.

In a unequal-length, or variable-length, encoding method, each data element in an image to be transmitted may be assigned a codeword of a different length. To minimize the total number of bits that must be transmitted, the shorter codewords are assigned to the data elements that appear most frequency in the image and the longer codewords are assigned to the data elements that occur less frequently in the image. By employing an unequal-length encoding method, the average length of a codeword transmitted is shorter than the average length of an equal-length codeword and, therefore, fewer bits are required to transmit an image. Using the example above and assigning codewords 0, 10, 110, and 111 to the symbols, respectively, it would take (50×1)+(30×2)+(10×3)+(10×3)=170 bits to transmit the image. This is less than the 200 bits required to send the image using the equal-length encoding method described above. In this example, the length of the average unequal-length codeword is 170/100=1.7.

Huffman coding is one form of unequal-length encoding method. Huffman coding is a method of constructing codewords for symbols in order to minimize the length of the average codeword. The frequency of occurrence of each unique symbol in the image must be determined. A codeword is assigned to each unique symbol in the image. To achieve the goal of minimizing the average length of the codewords, a complex equation is used to find the optimal way of assigning the shortest codewords to the symbols that occur most frequently in the image and assigning the longer codewords to the symbols that occur less frequently in the image. One of the difficulties in using an unequal-length encoding method where one codeword is assigned to each unique symbol to be transmitted is that the length of the codewords tends to grow rather quickly as the number of unique symbols grows. The longer the codewords, the more memory is required to store them. Storage may not be a problem for a user with a stand-alone mainframe computer that has nearly unlimited storage capability, but with ever increasing use of hand-held devices having ever increasing functionality, there is a need for a data encoding method that not only minimizes the number of bits to be transmitted but also minimizes the number of codewords required to encode data to be transmitted. The present invention is just such a method.

Data encoding may be used to encode each data element of an image to be transmitted, where the data element may be of a relatively high level of abstraction (e.g., a letter of an alphabet) or a primitive element (e.g., a dot, or pixel, or a certain color). Each data element may be encoded and transmitted. If the image to be transmitted contains a limited number of data elements (e.g., white pixels and black pixels in a facsimile transmission) where each data type element appears a number of times in a string, or run, of that data type then the data that must be transmitted may be greatly simplified. For example, a line of a facsimile may consist of 23 white pixels followed by 56 black pixels followed by 75 white pixels followed by 34 black pixels followed by 16 white pixels. In a conventional method, 204 codewords would be sent, one codeword per data element in the line. Instead, only five codewords need be sent, a codeword representing a run of 23 white pixels, a codeword representing a run of 56 black pixels, a codeword representing a run of 75 white pixels, a codeword representing 34 black pixels and a codeword representing 16 white pixels. Such an encoding method is referred to as run-length encoding. Run-length encoding greatly simplifies data encoding, but prior art run-length encoding methods still require a rather large number of codewords to represent all of the possible run lengths for each type of data element (e.g., pixels of any color). The prior art method described below illustrates this point.

The International Telecommunications Union (ITU) sets international telecommunication definitions and standards of facsimile equipment. One such standard is referred to as group 3 and is a standard for a facsimile device that enables a typical A4 (or United States 8.5 by 11.0 in.) page to be transmitted by a digital modem over a telephone-type circuit in one minute or less by employing digital-data compression techniques. Devices that follow the standard of group 3 are most relevant to the present invention. The ITU standard concerning group 3 (i.e., ITU-T Recommendation T.4) discloses the use of a modified Huffman code for unequal-length encoding. The modified Huffman code used in ITU Recommendation T.4 contains codewords that were generated using a numeral base of 64. One codeword is used to represent each unique data element to be transmitted. Two sets of 64 codewords each represent run lengths of 0, 1, . . . , 63 white and black pixels, respectively. Two sets of 27 of codewords each represent run lengths of 64, 128, . . . , 1728 white and black pixels, respectively. One set of 13 codewords represents run lengths of 1792, 1856, . . . , 2560 pixels of either color. Run lengths greater than 2624 pixels are indicated by words of 2560 pixels as needed. One codeword is used to represent an end-of-line (EOL) symbol. Therefore, to encode an 8.5 by 11.0 in. page (e.g., 5100 pixels at 600 dots, or pixels, per inch) using the modified Huffman code as in ITU-T recommendation T.4, 196 codewords are required. The present invention discloses a method that may be used to encode the same type of facsimile transmission using far fewer codewords.

U.S. Pat. No. 4,096,527, entitled "RUN LENGTH ENCODING AND DECODING METHODS AND MEANS"; U.S. Pat. No. 5,626,829, entitled "DATA COMPRESSION USING RUN LENGTH ENCODING AND STATISTICAL ENCODING"; U.S. Pat. No. 4,922,545, entitled "FACSIMILE IMAGE ENCODING METHOD"; U.S. Pat. No. 5,357,546, entitled "MULTIMODE AND MULTIPLE CHARACTER STRING RUN LENGTH ENCODING METHOD AND APPARATUS"; U.S. Pat. No. 5,541,595, entitled "VARIABLE LENGTH CODE DECODER FOR SIMULTANEOUS DECODING THE MOST SIGNIFICANT BITS AND THE LEAST SIGNIFICANT BITS OF A VARIABLE LENGTH CODE"; and U.S. Pat. No. 5,710,639, entitled "SCAN LINE COMPRESSED FACSIMILE COMMUNICATION SYSTEM," each disclose an encoding method involving equal-length encoding, unequal-length encoding, run-length encoding, the use of Huffman codes, and the application of the same to facsimile transmission, but none of these patents disclose a method of minimizing the number of codewords required to transmit an image as does the present invention. U.S. Pat. Nos. 4,096,527; 4,626,829; 4,922,545; 5,357,546; 5,541,595; and 5,710,639, are hereby incorporated by reference into the specification of the present invention.

SUMMARY OF THE INVENTION

It is an object of the present invention to minimize the number of codewords required to encode an image.

It is another object of the present invention to minimize the number of codewords required to encode an image using a base of a numeral system to represent all of data elements to be encoded.

It is another object of the present invention to minimize the number of codewords required to encode an image using a base of a numeral system to represent all of data elements to be encoded, where some of the data elements are encoded using more than one codeword.

It is another object of the present invention to minimize the number of codewords required to encode an image consisting of white pixels and black pixels using a base of a numeral system to represent all of data elements to be encoded, where some of the data elements are encoded using more than one codeword.

The present invention is a method of encoding data in an image in order to minimize the number of codewords required to encode the image. The best mode of the present method is a method of run-length encoding an image consisting of white pixels and black pixels. The present invention is not limited to the best mode but may be used to run-length encode an image consisting of pixels of nay color and to a encode each data element contained in an image.

The first step of the present invention is to acquire an image to encode.

The second step of the present invention is to determine all of the unique pixel run-lengths contained within the image on a line-by-line basis, irrespective of pixel color.

The third step of the present invention is to select a base of a numeral system to represent every unique pixel run-length determined in the last step.

The fourth step of the present method is to generate a number of unequal-length codewords equalling the number selected as the numerical base in the last step.

The fifth step of the present method is to determine, in order, the pixel run-lengths, on a line-by-line basis, for each pixel run-length contained in the image, where the counting on each line starts with a particular pixel color.

The sixth step of the present method is to represent each number determined in the last step in the selected numerical base.

The seventh step of the present method is to determine the frequency of occurrence of each digit resulting from the last step.

The eighth step of the present method is to assign the unequal-length codewords according to ascending length to the digits of the selected numerical base according to descending order of frequency of occurrence.

The ninth, and last, step of the present method is to run-length encode the image by replacing each digit resulting from the sixth step with the corresponding unequal-length codeword.

DETAILED DESCRIPTION

Figure 1:
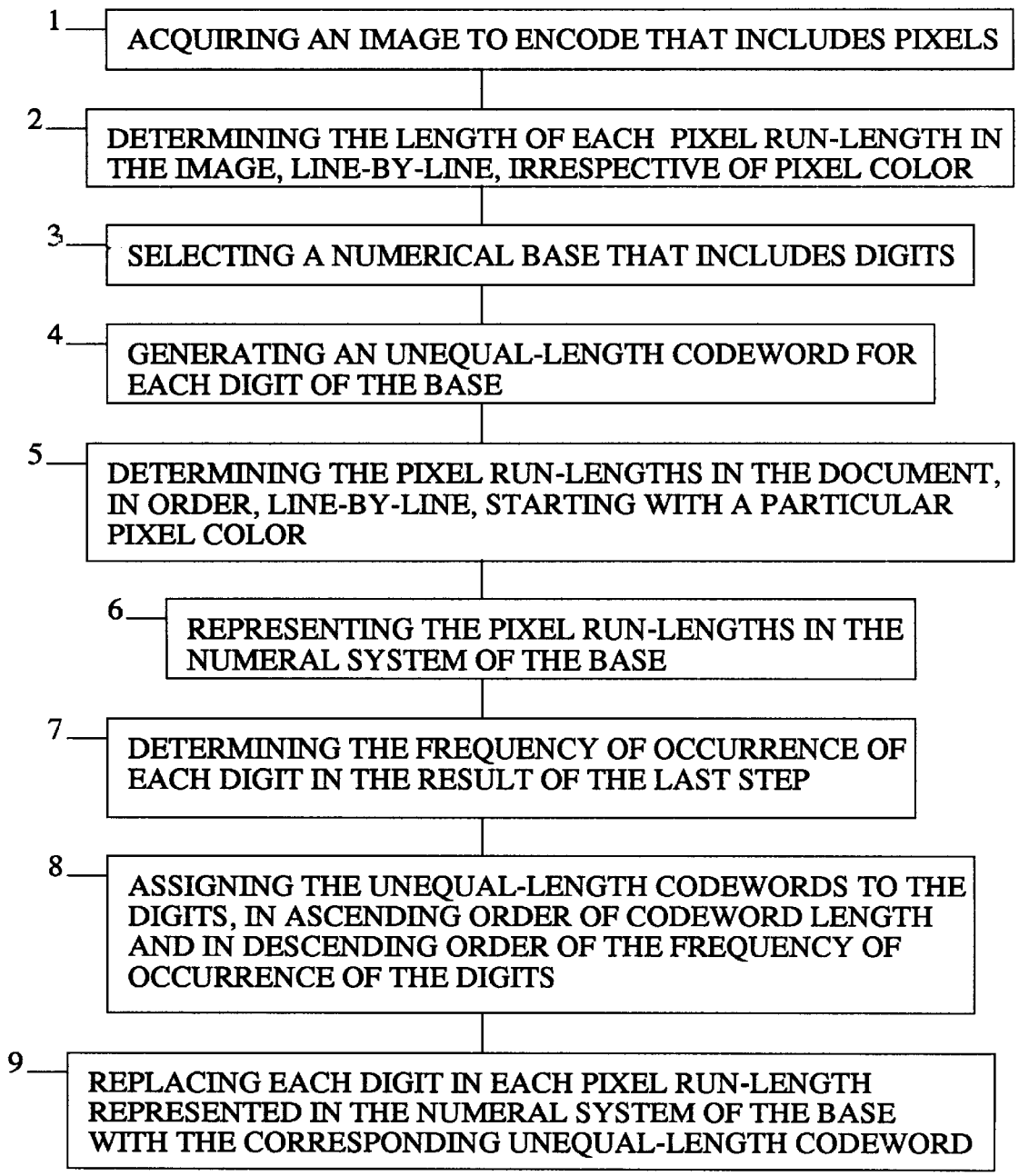
FIG. 1 is a list of steps of the present invention.

The present invention is a method of encoding data in an image in order to minimize the number of codewords required to encode the image. The best mode of the present method, as listed in FIG. 1, is a method of run-length encoding an image consisting of white pixels and black pixels. The present invention is not limited to the best mode but may be used to run-length encode an image consisting of pixels of any color and to encode each data element contained in an image.

The first step 1 of the present invention is to acquire an image to encode. In the best mode of the present invention, the image to be encoded includes one or more lines where each line includes strings, or runs, of white pixels and black pixels. An image that is 8.5 inches wide and contains printing at a resolution of 600 dots, or pixels, per inch contains 5100 pixels per line. The present invention is not limited to any particular number of pixels per line.

The second step 2 of the present invention is to determine all of the unique pixel run-lengths contained within the image on a line-by-line basis, irrespective of pixel color. In an alternate embodiment of the present invention, the second step would be to determine all of the unique data elements contained in the image (e.g., ASCII characters).

The third step 3 of the present invention is to select a base of a numeral system to represent every unique pixel run-length determined in the last step in order to minimize the number of codewords that will be required to represent all of the pixel run-lengths contained in the image. Possible choices for a base are the smallest integer that is greater than the square root of the longest pixel run-length contained in the image, the smallest integer that is greater than the cube root of the longest pixel run-length contained in the image, the smallest integer that is greater than the fourth root of the longest pixel run-length contained in the image, and so on. Other choices for a base are possible. If there are 5100 pixels per line then the longest pixel run-length per line may be 5100 pixels. If the longest pixel run-length in the image is 5100 then, according to the above-suggested choices for a numerical base, the base may be selected from the list of 72, 18, 9, and so on. Here, the numbers 72, 18, and 9 are in base ten but are not indicated as such because it is taken for granted that numbers are in base ten, but technically, these numbers should be identified as $72_{10}$, $18_{10}$, and $9_{10}$. If at least two numerical places are required in order to represent the length of at least one pixel run-length contained in the image then the present invention will require fewer codewords to represent the pixel run-lengths contained in the image as compared to a run-length encoding method that requires a unique codeword for each pixel run-length contained in the image to be encoded. For example, two places are required to represent a pixel run-length that is at least the size of the base (i.e., $72_{10}=10_{72}$, $18_{10}=10_{18}$, $9_{10}=10_9$ and so on). As will be described below in more detail, the present method only requires codewords for each digit contained in a particular base (e.g., digits 0–71 in base 72, digits 0–17 in base 18, digits 0–8 in base 9, and so on) instead of codewords for each unique pixel run-length. For example, a pixel run-length of $601_{10}$ pixels may be represented as $667_9$. As will be described below in more detail, the present invention uses only nine codewords in order to represent every pixel run length from $0_{10}$ to $601_{10}$ if 9 is selected as the numerical base. Prior art run-length encoding methods would require many more codewords.

The fourth step 4 of the present method is to generate a number of unequal-length codewords equalling the number selected as the numerical base in the last step. For example, seventy-two unequal-length codewords are generated if the numerical base selected is seventy-two. Note that codewords are generated only for each of the digits of the selected base and not for each pixel run-length contained in the image to be encoded. There may be far more unique pixel run-lengths contained in the image to be encoded then there are digits in the base. For example, only ten digits (i.e., 0–9) and, therefore, ten codewords are required to represent pixel run-lengths of nay length (e.g., a pixel run-length of $634_{10}$) in the image to be encoded, where the run-lengths are represented in base ten. The preferred method of generating unequal-length codewords is the Huffman code method, but other methods of generating unequal-length codewords are possible. For example, a set of unequal-length codewords may include codewords 0, 10, 110, 1110, 11110, and so on.

The fifth step 5 of the present method is to determine, in order, the pixel run-lengths, on a line-by-line basis, for each pixel run-length contained in the image, where the counting on each line starts with a particular pixel color. The reason for requiring the pixel run-lengths to be counted starting with a particular pixel color is to eliminate the need to have send additional information to indicate the color of a particular pixel run-length. This is one of the ways that the present method is able to minimize the number of codewords required to encode pixel run-lengths as compared to prior art run-length encoding methods that require a separate set of codewords for each pixel color. Eliminating the need to send information regarding pixel color is possible when the pixels contained in an image to be encoded is of only two colors (e.g., white pixels and black pixels). Each line is interpreted as starting with a pixel run-length of a particular color. In the preferred embodiment, each line is interpreted as starting with a run-length of white pixels. For example, a line starting with $1000_{10}$ white pixels followed by $2000_{10}$ black pixels followed by $1500_{10}$ black pixels followed by $600_{10}$ black pixels would be determined to contain pixel run-lengths of $1000_{10}$, $2000_{10}$, $1500_{10}$, and $600_{10}$. If the line actually starts with a run of white pixels then these numbers are taken as the run-lengths for the line. If a line starts with run of black pixels (e.g., $1500_{10}$ black pixels followed by $1000_{10}$ white pixels followed by $600_{10}$ black pixels followed by $2000_{10}$ white pixels) then the line would be interpreted as containing pixels run-lengths of $0_{10}$, $1500_{10}$, $1000_{10}$, $600_{10}$, and $2000_{10}$, where the first $0_{10}$ indicates a zero-length run of white pixels. A line that starts with a run of black pixels will be interpreted as starting with a zero-length run of white pixels. Requiring each line to start with a run of pixels of a particular color enables the present invention to require only one set of codewords that are used to represent both white pixels and black pixels and eliminates the need to have a separate set of codewords for pixels based on the color of the pixels as does prior art run-length encoding methods.

The sixth step 6 of the present method is to represent each number determined in the last step in the selected numerical base. For example, if a numerical base of eighteen is selected then a line having pixel run-lengths of $1000_{20}$, $2000_{10}$, $1500_{10}$, and $600_{10}$ would be represented as $31A_{18}$, $632_{18}$, $4B6_{18}$, and $1F6_{18}$, where $A_{18}=10_{10}$, where $B_{18}=11_{10}$, and where $F_{18}=15_{10}$.

The seventh step 7 of the present method is to determine the frequency of occurrence of each digit resulting from the last step. That is, the run-lengths of every run of pixels in the image to be encoded is determined in the fifth step 5; all of the run-lengths are converted to numerical base, as selected in the third step 3, in the sixth step 6; and frequency of occurrence of the digits in the converted numbers are determined in the seventh step. For example, if the entire image consisted of one line and the result of the sixth step 6 on this one line is $3_9$, $13_9$, $123_9$, and $3241_9$ then the digits contained in this image are $1_9$, $2_9$, $3_9$, and $4_9$. In descending order of frequency of occurrence, the digit $3_9$ occurs four times, the digit $1_9$ occurs three times, the digit $2_9$ occurs twice, and the digit $4_9$ occurs once. Note that the frequency of occurrence of the pixel run-lengths is not determined as is determined in prior art run-length encoding methods but the frequency of occurrence of the individual digits which are used to describe the length of each pixel run-length. A digit may only be a part of a particular pixel run-length but may not, by itself, represent the run-length of a particular pixel run-length. Determining the frequency of occurrence of the digits is one of the steps that enables the present invention to minimize the number of codewords required to encode pixel run-lengths of an image. Prior art run-length encoding methods determine the frequency of occurrence of all of the pixel run-lengths in an image to be encoded but not the frequency of occurrence of the digits, in a particularly chosen numerical base, that make up the pixel run-lengths as does the present method.

The eighth step 8 of the present method is to assign the unequal-length codewords generated in the fourth step 4 according to ascending length of the unequal codewords to the digits of the selected numerical base selected in the third step 3 according to descending order of frequency of occurrence of these digits. That is, the shortest codeword is assigned to the most frequently occurring digit, the next shortest codeword is assigned to the next most frequently occurring digit, and so on until each digit is assigned a codeword. For example, if the entire image consisted of one line and the result of the sixth step 6 on this one line is $3_9$, $13_9$, $123_9$, and $3241_9$ then the digits contained in this image are $1_9$, $2_9$, $3_9$, and $4_9$. In descending order of frequency of occurrence, the digit $3_9$ occurs four times, the digit $1_9$ occurs three times, the digit $2_9$ occurs twice, and the digit $4_9$ occurs once. Therefore, the codeword having the shortest length will be assigned to the digit $3_9$, the next shortest codeword will be assigned to the digit $1_9$, the next shortest codeword will be assigned to the digit $2_9$, and the longest codeword will be assigned to the digit $4_9$. Any suitable algorithm may be used to assign codewords when two or more digits have the same frequency of occurrence.

The ninth, and last, step 9 of the present method is to run-length encode the image by replacing each digit resulting from the sixth step 6 with the corresponding unequal-length codeword. The present method minimizes the number of codewords by assigning codewords only to the digits of the numerical base selected. Any run-lengths may be represented using just the codewords of the digits of the numerical base without having to have a codeword for each run-length that appears in the image. For example, the codewords associated with the three digits (e.g., 0,1,2 in base ten, where the base is not expressly shown) may be used to encode many different run-lengths (e.g., 0, 1, 2, 10, 11, 12, 20, 21, 22, 100, 101, 102, 110, 111, 112, 120, 121, 122, 200, 201, 202, 210, 211, 212, 220, 221, and 222) by combining the codewords associated with the digits accordingly. If a run-length must be described using more than one place of the selected numerical base then more than one codeword must be used to represent the run-length. Note that the present method minimizes the number of codewords required to encode pixel run-lengths but may not necessarily minimize the total number of bits required to encode a particular image. The present method is may be used in applications where a minimum amount of memory to allocate for the storage of codewords (e.g., hand-held devices).

The present invention converts pixel run-lengths of an image to be encoded into a series of numbers in a selected numerical base. The base is selected to minimize the number of codewords that are required to represent all of the pixel run-lengths. Unequal-length codewords for each digit in the base are generated. The frequency of occurrence of the digits of the base within the pixel run-lengths of the image are determined. The codewords are assigned to the digits of the base so that the shortest codewords are assigned to the most frequently occurring digits. The image is encoded by replacing each digit of each pixel run-lengths represented in the selected numerical base with the corresponding codeword. Note that pixel run-lengths are represented by more than one place in the selected numerical base require more than one codeword in order to encode that pixel run-length. In fact, the number of places required to represent a pixel run-length is the number of codewords required to encode that run-length. So, the present method accomplishes the stated goal of minimizing the number of codewords required to run-length encode an image without necessarily minimizing the total number of bits required to encode the same. The present invention is most useful for applications that have the least amount of memory available to store codewords (e.g., hand-held devices).

The encoding method of ITU Recommendation T.4 requires 196 codewords to encode an image containing 5100 pixels per line. That is, ITU Recommendation T.4 requires 64 codewords to represent white pixel run-lengths of 0–63, 64 codewords to represent black pixel run-lengths of 0–63, 27 codewords to represent white pixel run-lengths of 27 multiples of 64, 27 codewords to represent black pixel run-lengths of 27 multiples of 64, 13 codewords to represent 13 additional multiples of 64 of either pixel color, and one codeword to represent the end of the line (EOL). To do the same thing, the present invention only requires a number of codewords equal to the base selected to encode an image (e.g., 72 codewords for a base of 72, 18 codewords for a base of 18, 9 codewords for a base of 9, and so on).

What is claimed is:

1. A method of run-length encoding an image containing runs of white pixels and black pixels, comprising the steps of:
   a) acquiring the image to encode;
   b) determining the length of all unique pixel run-lengths contained within the image on a line-by-line basis, irrespective of pixel color;
   c) selecting a base of a numeral system, where the base is made up of digits;
   d) generating a number of unequal-length codewords equal to the base;
   e) determining, in order, pixel run-lengths, on a line-by-line basis, for each pixel run-length contained in the image, where counting on each line starts with a particular pixel color;
   f) representing each pixel run-length determined in step (e) in the numeral system of the base;
   g) determining the frequency of occurrence of each digit resulting from step (f);
   h) assigning the unequal-length codewords, according to ascending length of the unequal-length codewords, to the digits according to descending order of frequency of occurrence of the digits; and
   i) encoding the image by replacing each digit resulting from step (f) with the corresponding unequal-length codeword.

2. The method of claim 1, wherein said step of determining the length of all unique pixel run-lengths contained within the image on a line-by-line basis, irrespective of pixel color is comprised of the step of determining the length of all unique pixel run-lengths contained within the image on a line-by-line basis, assuming that each line begins with a run of white pixels.

3. The method of claim 1, wherein said step of selecting a base of a numeral system, where the base is made up of digits is comprised of selecting a base of a numeral system, where the base is made up of digits, and where the base is a root of the largest pixel run-length contained in the image to be encoded.

4. The method of claim 1, wherein said step of generating a number of unequal-length codewords equal to the base is comprised of generating a number of unequal-length codewords equal to the base using a Huffman code algorithm.

5. The method of claim 1, wherein said step of determining, in order, pixel run-lengths, on a line-by-line basis, for each pixel run-length contained in the image, where counting on each line starts with a particular pixel color is comprised of determining, in order, pixel run-lengths, on a line-by-line basis, for each pixel run-length contained in the image, where counting on each line starts with a white pixels.

6. The method of claim 2, wherein said step of selecting a base of a numeral system, where the base is made up of digits is comprised of selecting a base of a numeral system, where the base is made up of digits, and where the base is a root of the largest pixel run-length contained in the image to be encoded.

7. The method of claim 6, wherein said step of generating a number of unequal-length codewords equal to the base is comprised of generating a number of unequal-length codewords equal to the base using a Huffman code algorithm.

8. The method of claim 7, wherein said step of determining, in order, pixel run-lengths, on a line-by-line basis, for each pixel run-length contained in the image, where counting on each line starts with a particular pixel color is comprised of determining, in order, pixel run-lengths, on a line-by-line basis, for each pixel run-length contained in the image, where counting on each line starts with a white pixels.

* * * * *